United States Patent [19]

Matsui

[11] Patent Number: 5,268,599

[45] Date of Patent: Dec. 7, 1993

[54] TTL TO CMOS INPUT BUFFER USING CMOS STRUCTURE

[75] Inventor: Masataka Matsui, Tokyo, Japan

[73] Assignee: Kabushiki Kaisha Toshiba, Kawasaki, Japan

[21] Appl. No.: 766,357

[22] Filed: Sep. 26, 1991

[30] Foreign Application Priority Data

Sep. 27, 1990 [JP] Japan ................ 2-255073

[51] Int. Cl.⁵ ................ H03K 19/092; H03K 19/094
[52] U.S. Cl. .................... 307/475; 307/451; 307/446; 307/296.8
[58] Field of Search ............ 307/451, 475, 296.8

[56] References Cited

U.S. PATENT DOCUMENTS

| | | | |
|---|---|---|---|
| 4,642,488 | 2/1987 | Parker | 307/451 |
| 5,010,259 | 4/1991 | Inoue et al. | 307/451 |
| 5,021,685 | 6/1991 | Kihara | 307/451 |
| 5,073,726 | 12/1991 | Kato et al. | 307/451 |

Primary Examiner—Edward P. Westin
Assistant Examiner—Richard Roseen
Attorney, Agent, or Firm—Finnegan, Henderson, Farabow, Garrett & Dunner

[57] ABSTRACT

The present invention provides a buffer circuit, which comprises a CMOS logic gate circuit in which at least one gate input terminal is input from other circuit, a MOS transistor for controlling a threshold voltage, which is inserted in series into a current path between power source electrodes of the CMOS logic gate circuit including MOS transistors connected to the input terminal, and a control circuit for controlling a gate voltage of the MOS transistor for controlling the threshold voltage such that the logic threshold voltage in the input terminal coincides with a predetermined logic threshold voltage without depending on variation in a power supply voltage, temperature, or a manufacturing process. The logic threshold voltage of the buffer circuit can be maintained constantly without depending on variation in the power supply voltage or temperature.

5 Claims, 3 Drawing Sheets

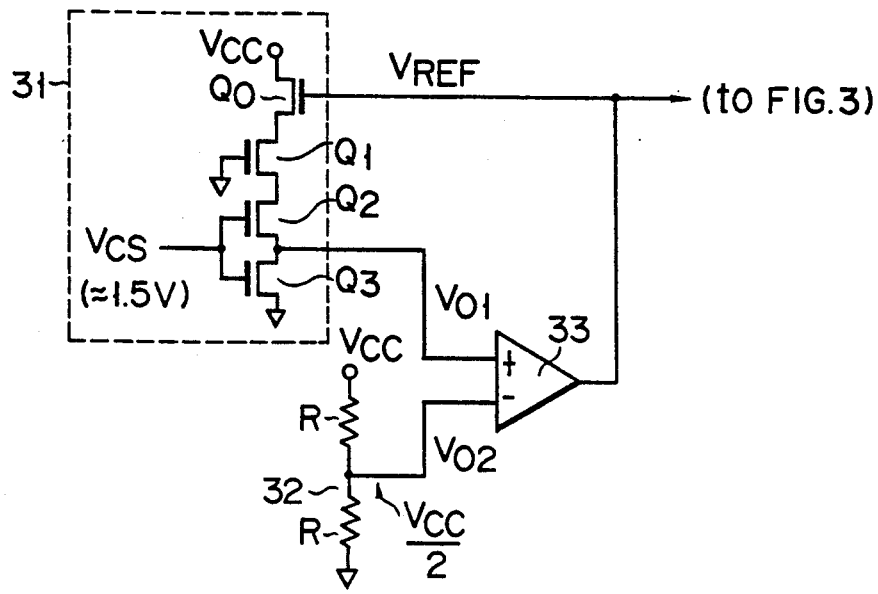
FIG. 9
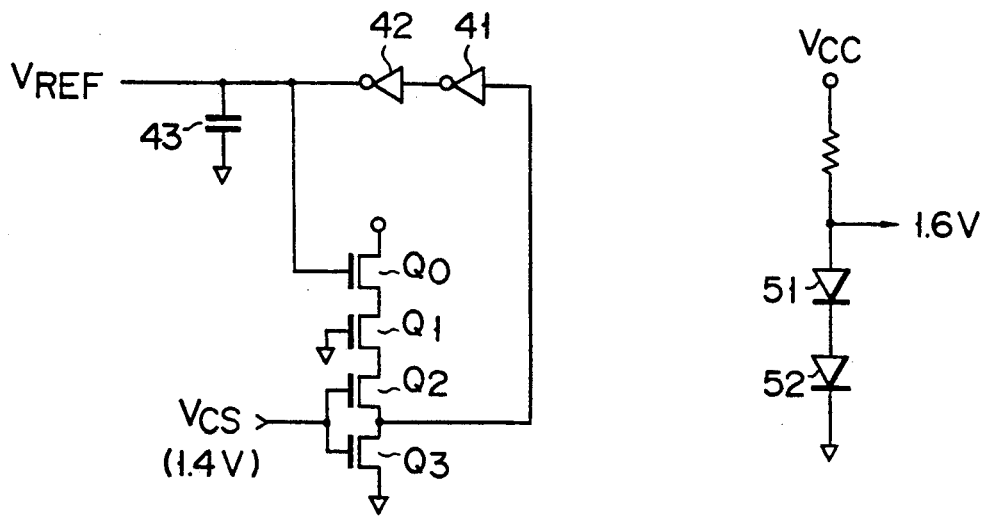
FIG. 10
FIG. 11

TTL TO CMOS INPUT BUFFER USING CMOS STRUCTURE

BACKGROUND OF THE INVENTION

1. Field of the Invention

The present invention relates to a buffer circuit, which is suitable for an input interface circuit receiving an input signal from the outside of a chip of a semiconductor integrated circuit using a CMOSFET (Complementary Metal Oxide Semiconductor Field Effect Transistor), and particularly used as an input buffer circuit suitable for a TTL (Transistor—Transistor Logic) input/output protocol.

2. Description of the Related Art

FIG. 1 shows a typical circuit diagram of a TTL input buffer circuit obtained by a conventional technique. This circuit is two-input NOR circuit using the most basic push-pull logic circuit technique of a CMOS structure. $Q_1$ and $Q_2$ are PMOS (P channel type MOS) transistors, and $Q_3$ and $Q_4$ are NMOS (N channel type MOS) transistors. A denotes an input signal from the external portion of a chip, and reference numeral 11 denotes an input signal terminal of the chip. If a chip selection signal $\overline{CS^*}$ is in a selection mode, that is, low potential level ("0" level), an inverting signal of the input signal A ($\overline{A}$) is output as an output signal A. If the chip selection signal $\overline{CS^*}$ is in a non-selection mode, the output signal $\overline{A}$ is set to "0" level.

Since the signal $CS^*$ is generated in the chip, the so-called CMOS logic level, that is, a high potential level ("1" level) is 5 V (power source potential) and a low potential level ("0" level) is 0 V (earth potential). An input/output signal of the external section of the chip, generally is operated at a logical level, which is suitable for TTL input/output protocol. At this time, the input level "1" is 2.2 V (or 2.0 V) or more, and the input level "0" is 0.8 V or less. Regarding a logical amplitude of TTL circuit, for example, the high potential level is 3.4 and the low potential level is 0.4 V, and an amplitude margin is small in the TTL circuit.

At this time, a logical threshold voltage (inverting voltage) of input A of a NOR circuit in FIG. 1 is preferably 1.5 V, which is an intermediate level ("½" level) between "1" level and "0" level, in view of a noise margin. Particularly, since the logical amplitude is large in the TTL circuit, and large noise is generated, it is required that the logic threshold voltage of the input of the CMOS logic circuit be constant. A gate width W of each transistor and a gate length L are selected to adjust to the threshold voltage 1.5 V. In this case, the logical threshold voltage $V_{INV}$ can be expressed by the following simple approximate expressions if an analytical method wherein a current voltage characteristic of the MOS transistor is expressed by Shockley type is used.

$$V_{INV} = \frac{V_{CC} + V_{TN}\sqrt{\beta_N/\beta_P} + V_{TP}}{1 + \sqrt{\beta_N/\beta_P}} \quad (1)$$

$$\beta_N/\beta_P = W_{n1}/L_{n1} \cdot \mu_N / \left( \frac{1}{\frac{1}{W_{P1}/L_{P1}} + \frac{1}{W_{P2}/L_{P2}}} \right) \cdot \mu_P \quad (2)$$

wherein $V_{CC}$ is power supply voltage, $V_{TN}$, $V_{TP}$ are a threshold voltage of NMOS transistor and that of PMOS transistor, respectively, $W_{n1}/L_{p1}$, $W_{n2}/L_{p2}$ are gate width/gate length of the respective transistors $Q_3$, $Q_1$, $Q_2$, and $\mu_N$ and $\mu_P$ are carrier mobility of NMOS transistor and that of PMOS transistor, respectively.

The above conventional circuit may be designed such that $V_{INV}$ in expression (1)=1.5 V under a standard voltage by controlling $\beta_N/\beta_P$ (that is, size of transistor). However, in TTL input/output protocol, $V_{CC}=5$ V $\pm 0.5$ V, and $V_{INV}$ definitely changes if the power supply voltage $V_{CC}$ changes in the TTL input/output protocol. However, since $V_{TN}$ and $V_{TP}$ must be allowed to vary in the range of $\pm 0.2$ V in the variation in the manufacturing process, this generates variation of $V_{INV}$. Moreover, $V_{TN}$, $V_{TP}$, $\beta_N$, and $\beta_P$ varies by influence of the change of temperature. Due to this, in the prior art, $V_{INV}$ easily varies in the range of $\pm 0.5$ V in the TTL input/output protocol, so that noise margin in the TTL input/output protocol of the input level in FIG. 1 is largely reduced. There is need for the output buffer to be delayed in order to avoid increasing noise. However, this will prevent the high speed performance of the operation frequency of LSI.

In order to overcome the above disadvantage, the prior art of FIG. 2 shows a system in which a standard voltage source $V_{CS}$ (about 1.5 V) where a power supply voltage characteristic and a temperature characteristic are compensated and an input signal A from the external unit are compared and amplified by a CMOS type differential amplifier 21, thereafter obtaining an inverting signal of the input signal A through a NOR circuit. According to this system, the output voltage of the CMOS type differential amplifier 21 is largely amplified to the amplitude (0 to 5 V) of a CMOS circuit. Due to this, it can be discriminated whether input signal level is "1" or "0" without depending on the change of the power supply voltage and that of the temperature. However, the speed of the input buffer circuit was delayed by the operation response speed of the differential amplifier 21.

SUMMARY OF THE INVENTION

An object of the present invention is to provide a buffer circuit suitable for a TTL input buffer circuit wherein a logic threshold voltage can be constantly maintained without depending on a power supply voltage and a change of temperature, a noise margin is largely provided, and an operation speed is fast.

The buffer circuit of the present invention comprises a CMOS logic gate circuit in which at least one gate input terminal is input from other circuit; a MOS transistor for controlling a threshold voltage, which is inserted in series into a current path between power source electrodes of the CMOS logic gate circuit including MOS transistors connected to the input terminal; and a control circuit for controlling a gate voltage of the MOS transistor for controlling the threshold voltage such that the logic threshold voltage in the input terminal coincides with a predetermined logic threshold voltage without depending on variation in a power supply voltage or temperature.

According to the present invention, variation in temperature and voltage characteristic are canceled by controlling the gate voltage of the MOS transistor for controlling the threshold voltage inserted into the conventional CMOS logic gate circuit. Due to this, the logic threshold voltage of the logic gate circuit is constantly maintained. Moreover, for example, the MOS transistor for controlling the threshold voltage is structured such that a signal can be directly transmitted by only the CMOS logic gate circuit. For this reason, delay elements in the signal transmission are reduced, thereby making it possible to provide a high speed operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9 and 10 are circuit diagrams showing a control circuit of the above embodiments, respectively; and FIG. 11 is a circuit diagram showing a reference voltage generating circuit of the above embodiment.

DETAILED DESCRIPTION OF THE PREFERRED EMBODIMENTS

The embodiments of the present invention will be explained with reference to the drawings.

Figure 1:
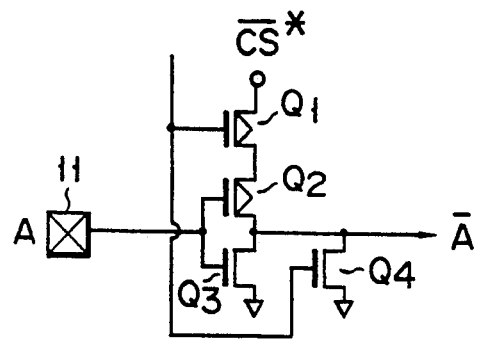
FIGS. 1 and 2 are circuit diagrams showing a conventional input buffer circuit, respectively.
Figure 3:
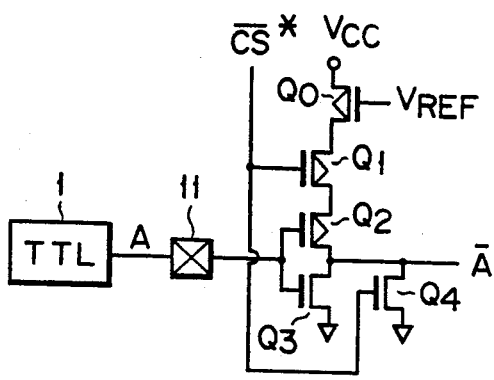
FIGS. 3 to 8 are circuit diagrams showing a buffer circuit of each embodiment of the present invention, respectively.

In the embodiments, the same reference numerals are added to the common portions. In the embodiment of FIG. 3, similar to the prior art of FIG. 1, a push-pull type two input NOR circuit is formed of transistors $Q_1$, $Q_2$, $Q_3$, and $Q_4$, and A denotes an input terminal from an external portion of a chip, CS* denotes a chip selection signal.

A PMOS transistor $Q_0$ is inserted in series into a through current path for determining a logic threshold voltage between a power supply $V_{CC}$ terminal-$Q_1$-$Q_2$-$Q_3$-ground terminal and an input terminal 11. Thereby, there is formed a buffer circuit, which can control the logic threshold voltage. A TTL circuit 1 is provided in the external portion of the chip which is a front stage of the input terminal 11 of a semiconductor chip having a CMOS circuit of FIG. 3. A gate potential $V_{REF}$ of the PMOS transistor $Q_0$ is controlled such that the logic threshold of the input terminal 11 is maintained to be 1.5 V.

In the circuit of FIG. 3, if the power supply $V_{CC}=5$ V, the potential of $V_{REF}$ is set such that the threshold voltage is 1.5 V. If the power supply $V_{CC}$ rises, $V_{REF}$ rises and if the power supply $V_{CC}$ drops, $V_{REF}$ drops whereby the variation of the logic threshold voltage $V_{INV}$ is controlled. Influence, which is exerted by the variation of the threshold voltage in the temperature characteristic—transistor circuit, can be overcome by changing $V_{REF}$. This means that $\beta_N/\beta_p$ is controlled based on the expression (1) and $V_{INV}$ is constantly maintained to be 1.5 V. The $V_{REF}$ generating circuit will be explained later.

Figure 4:
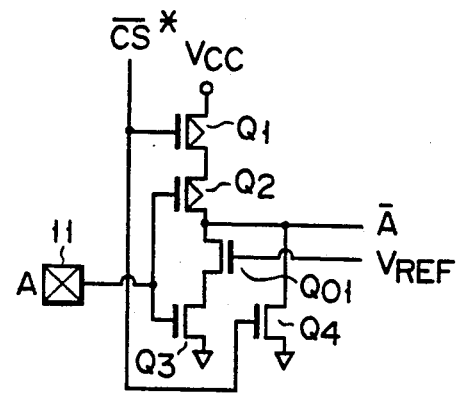

FIG. 4 shows other embodiment of the present invention. This shows a case in which an NMOS transistor $Q_{01}$ for controlling a threshold voltage is inserted between transistors $Q_2$ and $Q_3$ of the current passage of the logic gate. In this case, $V_{REF}$ controls the gate potential of the transistor $Q_{01}$ to maintain the threshold voltage constant under $V_{INV}=1.5$ V.

Figure 5:
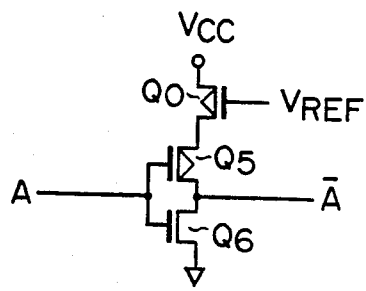
Figure 6:
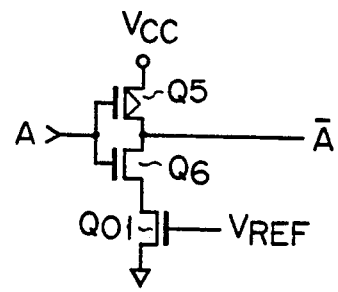
Figure 7:
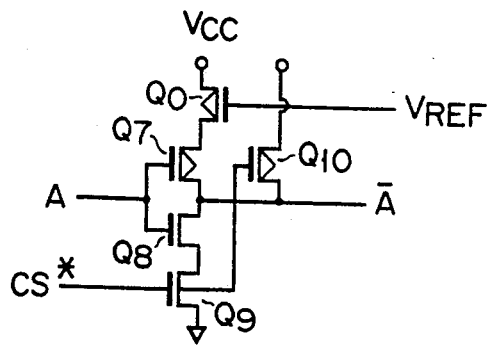
Figure 8:
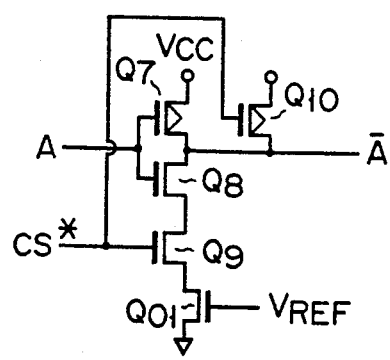

The buffer circuit of the present invention can be structured by use of not only NOR circuit but also an inverter and an NAND circuit. FIGS. 5 and 6 show the other embodiment of the present invention using the inverter. FIGS. 7 and 8 show the other embodiment of the present invention using the NAND circuit. The inverter comprises CMOS transistors $Q_5$ and $Q_6$ and the NAND circuit comprises CMOS transistors $Q_7$ to $Q_{10}$. In these structures, the transistors $Q_0$ and $Q_{01}$ for controlling threshold voltage are inserted in series into the current through passage. The transistors control the gate voltage to maintain the threshold voltage of the circuit constant under $V_{INV}=1.5$ V.

FIG. 9 shows the specific example of a control voltage generating circuit for generating control voltage $V_{REF}$.

As shown in the drawing, there is provided a monitor circuit 31 for monitoring threshold voltage whose transistor size is the size of the input buffer circuit or proportional to the width of the transistor. As an input of the monitor circuit 31, there is used a reference voltage generating circuit in which a power supply voltage and a temperature characteristic are compensated. In this case, a reference voltage is set to about 1.5 V. FIG. 11 shows a simple example of the reference voltage generating circuit in which diodes 51 and 52 are arranged in a two step manner. Also, there can be used a band-gap reference circuit having a bipolar element ($V_{CS}=1.3$ V) so as to improve a compensation characteristic. Thereby, there can be realized a state that $V_{CS}$, which is the same as the logic threshold voltage, is input to the monitor circuit 31. The output $V_{01}$ of the monitor circuit 31 and the output $V_{02}$ of a voltage generating circuit 32 having VCC/2, which is formed of resistance division using resistors R and R, are amplified by a differential amplifying circuit 33 to obtain $V_{REF}$, and the obtained $V_{REF}$ is fed back to the gate of the transistor $Q_0$. Thereby, $V_{REF}$ is controlled to obtain $V_{01}=V_{02}$. It can be said that the transistor $Q_0$ is controlled by $V_{REF}$ to obtain $V_{01}=V_{02}=2.5$ V. In other words, in the back stage (FIG. 3) of FIG. 9, the threshold voltage $V_{INV}$ is controlled to be 1.5 V in the input section, and the threshold voltage is changed to 2.5 V (constant value) in the MOS circuit.

In other words, the above-mentioned fact means that there can be realized a state that the logic circuit threshold voltage of the input buffer circuit is set to $V_{CS}$. By such feedback-controlling, the circuit threshold of the input buffer circuit of FIG. 3 can be maintained constant to be substantially $V_{CS}=1.5$ V, without variation in the power supply voltage or temperature or the manufacturing process. The $V_{CS}$ generating circuit may be, of course, further improved if the band-gap reference circuit is used in the $V_{CS}$ generating circuit.

FIG. 10 shows the other embodiment of the control circuit. In this embodiment, inverters 41 and 42 are used as feedback amplifying means. A threshold control voltage $V_{REF}$ can be obtained from one end of a condenser 43 of the output portion of the inverter 42.

Figure 2:
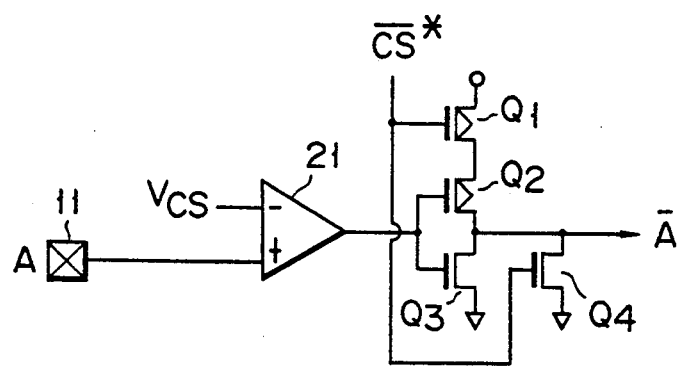

In the buffer circuit receiving the input from the TTL circuit 1, the gate potential of the MOS transistor, which is inserted into the current passage determining the logic threshold voltage of the signal input terminal from the external unit, is feedback-controlled by the monitor circuit 31 to maintain the logic threshold voltage constant to be 1.5 V. Thereby, there can be provided a buffer circuit in which the logic threshold voltage can be maintained constantly without variation in the power supply voltage or temperature or the manufacturing process, thereby obtaining a high noise margin, and the high-speed operation can be obtained without providing the differential amplifying stage 21 of FIG. 2.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A buffer circuit comprising:
 a TTL output buffer;
 a CMOS logic gate circuit;
 said CMOS logic gate circuit including a plurality of first transistors having a CMOS logic structure and having respective transistor current paths connected in series,
 said CMOS logic gate circuit further including a MOS transistor having another current path connected in series with said respective current paths of said first transistors to control a logic gate threshold voltage of said CMOS logic gate circuit,
 the plurality of first transistors and said MOS transistor being connected between two power source electrodes,
 at least one gate input terminal commonly connected to the gate electrodes of at least two of said first transistors and receiving a signal from the TTL output buffer,
 an output terminal provided from a junction between the series connected current paths of two of said first transistors;
 a logic threshold voltage of said CMOS logic gate circuit being controlled by a gate voltage of said MOS transistor such that the logic threshold voltage coincides with a predetermined logic threshold voltage substantially independent of any variation in the power supply voltage, temperature, or manufacturing process; and
 a control circuit for controlling the gate voltage applied to said MOS transistor,
 wherein said control circuit comprises a dummy CMOS logic gate circuit including another MOS transistor for controlling a threshold voltage of said dummy CMOS logic gate circuit, the dummy CMOS logic gate circuit and the logic gate circuit being structured to be substantially the same with the gates of said MOS transistor and said other MOS transistor being interconnected, and a feedback circuit for amplifying an output of said dummy CMOS logic gate circuit from its output terminal and for feeding an amplified output back to the gate of said other MOS transistor for controlling said CMOS logic gate circuit and said dummy CMOS logic gate circuit.

2. The buffer circuit according to claim 1, wherein said feedback circuit includes a differential amplifying circuit to which there is applied as an input voltage equal to the difference between the output of said dummy CMOS logic gate circuit and a substantially $\frac{1}{2}$ voltage of the power supply voltage of said CMOS logic gate circuit.

3. The buffer circuit according to claim 1, wherein all of a first predetermined number of MOS transistors arranged between one of the two power source electrodes and the output terminal are P-channel type, and all of a second predetermined number of MOS transistors arranged between the other one of two power source electrodes and the output terminal are N-channel type.

4. The buffer circuit according to claim 3 wherein each of said first and second predetermined numbers is greater than one.

5. The buffer circuit according to claim 3 wherein one of said first and second predetermined numbers is one and the other predetermined number is greater than one.

* * * * *